United States Patent
Chang et al.

(10) Patent No.: US 8,969,145 B2
(45) Date of Patent: Mar. 3, 2015

(54) WIRE-LAST INTEGRATION METHOD AND STRUCTURE FOR III-V NANOWIRE DEVICES

(71) Applicant: International Business Machines Corporation, Armonk, NY (US)

(72) Inventors: Josephine B. Chang, Mahopac, NY (US); Isaac Lauer, Yorktown Heights, NY (US); Jeffrey W. Sleight, Ridgefield, CT (US); Amlan Majumdar, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 13/745,770

(22) Filed: Jan. 19, 2013

(65) Prior Publication Data
US 2014/0203238 A1 Jul. 24, 2014

(51) Int. Cl.
*H01L 29/78* (2006.01)
*H01L 29/66* (2006.01)
(Continued)

(52) U.S. Cl.
CPC .......... *H01L 29/785* (2013.01); *H01L 29/6681* (2013.01); *B82Y 10/00* (2013.01);
(Continued)

(58) Field of Classification Search
CPC ................ B82Y 40/00; H01L 21/7624; H01L 21/76264; H01L 21/823431; H01L 21/823821; H01L 21/84; H01L 21/845; H01L 27/0886; H01L 27/0924; H01L 27/1203; H01L 27/1211; H01L 29/41791; H01L 29/66439; H01L 29/66545; H01L 29/66795; H01L 29/775; H01L 29/785; Y10S 977/762; Y10S 977/938

USPC ...................... 257/347, 9; 438/157, 479, 156
See application file for complete search history.

(56) References Cited

U.S. PATENT DOCUMENTS 5,886,380 A * 3/1999 Nakajima ..................... 257/321
7,230,286 B2 6/2007 Cohen et al.
(Continued)

FOREIGN PATENT DOCUMENTS

WO WO2012074872 A2 6/2012
WO WO2013101230 A1 * 7/2013 .............. H01L 29/78

OTHER PUBLICATIONS

U.S. Appl. No. 13/550,861, filed Jul. 17, 2012 by Bangsaruntip et al., entitled "Replacement Gate Fin First Wire Last Gate All Around Devices."
(Continued)

*Primary Examiner* — Khiem D Nguyen
*Assistant Examiner* — Pauline Vu
(74) *Attorney, Agent, or Firm* — Louis J. Percello; Michael J. Chang, LLC (57) ABSTRACT

In one aspect, a method of fabricating a nanowire FET device includes the following steps. A layer of III-V semiconductor material is formed on an SOI layer of an SOI wafer. Fins are etched into the III-V material and SOI layer. One or more dummy gates are formed over a portion of the fins that serves as a channel region of the device. A gap filler material is deposited onto the wafer. The dummy gates are removed selective to the gap filler material, forming trenches in the gap filler material. The SOI layer is removed from portions of the fins within the trenches thereby forming suspended nanowire channels in the channel regions of the device. The trenches are filled with at least one gate material to form one or more replacement gates surrounding the nanowire channels in a gate-all-around configuration.

15 Claims, 12 Drawing Sheets

(51) Int. Cl.
  *B82Y 10/00* (2011.01)
  *H01L 29/06* (2006.01)
  *H01L 29/20* (2006.01)

(52) U.S. Cl.
  CPC ......... *H01L29/0673* (2013.01); *Y10S 977/762* (2013.01); *Y10S 977/938* (2013.01); *H01L 29/2003* (2013.01)
  USPC ............... 438/156; 257/9; 257/347; 438/479; 977/762; 977/938

(56) References Cited

U.S. PATENT DOCUMENTS

| | | | |
|---|---|---|---|
| 7,534,675 B2 | 5/2009 | Bangsaruntip et al. | |
| 7,749,905 B2 | 7/2010 | Cohen et al. | |
| 7,795,677 B2 | 9/2010 | Bangsaruntip et al. | |
| 2001/0042894 A1* | 11/2001 | Brigham et al. | 257/408 |
| 2007/0029586 A1* | 2/2007 | Orlowski | 257/287 |
| 2009/0057762 A1* | 3/2009 | Bangsaruntip et al. | 257/347 |
| 2010/0207208 A1* | 8/2010 | Bedell et al. | 257/346 |
| 2011/0031473 A1* | 2/2011 | Chang et al. | 257/24 |
| 2011/0233522 A1 | 9/2011 | Cohen et al. | |
| 2011/0253981 A1 | 10/2011 | Rooyackers et al. | |
| 2012/0007051 A1 | 1/2012 | Bangsaruntip et al. | |
| 2013/0161756 A1* | 6/2013 | Glass et al. | 257/369 |
| 2014/0021538 A1* | 1/2014 | Bangsaruntip et al. | 257/331 |
| 2014/0084343 A1* | 3/2014 | Dewey et al. | 257/192 |

OTHER PUBLICATIONS

T. Tezuka et al., "Fabrication of strained Si on an ultrathin SiGe-on-insulator virtual substrate with a high-Ge fraction," Applied Physics Letters, vol. 79, No. 12, Sep. 17, 2001.

Wernersson et al., III-V Nanowires—Extending a Narrowing Road, vol. 98, 0018-9219/2010 IEEE No. 12, Dec. 2010 | Proceedings of the IEEE.

* cited by examiner

WIRE-LAST INTEGRATION METHOD AND STRUCTURE FOR III-V NANOWIRE DEVICES

FIELD OF THE INVENTION

The present invention relates to III-V material-based nanowire field-effect transistor (FET) devices and more particularly, to wire-last integration techniques for producing III-V material-based nanowire FET devices.

BACKGROUND OF THE INVENTION

Gate-all-around field effect transistors (FETs) offer the ultimate in scaling potential by virtue of offering the best electrostatics of any currently known device geometry. However, a drawback to employing a gate-all-around configuration is the difficulty of fabricating deeply scaled devices starting with nanowires due to the fragility of the nanowires. Thus, most process steps performed after the nanowire has been formed must be carefully tuned to preserve the nanowire.

Additionally, gate-all-around FETs are typically formed using either a gate-first or a gate-last process. In any gate-first process flow, the gate material must be removed from beneath the source/drain region of the device by some undercut method which, using conventional techniques, also results in critical dimension loss of the gate line itself, hurting process and device scalability. In wire-before-gate, gate-first, or replacement gate processes, the nanowire must be suspended using a landing pad region, which hurts layout efficiency.

Thus, techniques that solve the above-described problems associated with gate-all-around FET device fabrication would be desirable.

SUMMARY OF THE INVENTION

The present invention relates to wire-last integration techniques for producing III-V material-based nanowire field-effect transistor (FET) devices. In one aspect of the invention, a method of fabricating a nanowire FET device is provided. The method includes the following steps. A semiconductor-on-insulator (SOI) wafer is provided having an SOI layer over a buried oxide (BOX). A layer of III-V semiconductor material is formed on the SOI layer. Fins are etched into the III-V semiconductor material and the SOI layer. A dummy gate dielectric is formed on the fins. One or more dummy gates are formed over a portion of the fins that serves as a channel region of the device, wherein the dummy gates are separated from the fins by the dummy gate dielectric. Spacers are formed on opposite sides of the dummy gates. A gap filler material is deposited onto the wafer filling spaces between the fins and the dummy gates. The dummy gates and the dummy gate dielectric are removed selective to the gap filler material, forming trenches in the gap filler material. The SOI layer is removed from portions of the fins within the trenches thereby forming suspended nanowire channels in the channel regions of the device, wherein portions of the fins outside of the trenches will serve as source and drain regions of the device. The trenches are filled with at least one gate material to form one or more replacement gates surrounding the nanowire channels in a gate-all-around configuration.

In another aspect of the invention, a nanowire FET device is provided. The nanowire FET device includes at least one fin formed on a wafer, wherein the fin comprises (i) portions having a layer of a III-V semiconductor material on an SOI layer which serve as source and drain regions of the device, and (ii) portions of the III-V semiconductor material released from the fin which serve as a nanowire channel of the device; a gap filler material surrounding the fin; and at least one gate, formed within a trench in the gap filler material, that surrounds the nanowire channel in a gate all around configuration.

A more complete understanding of the present invention, as well as further features and advantages of the present invention, will be obtained by reference to the following detailed description and drawings.

DETAILED DESCRIPTION OF PREFERRED EMBODIMENTS

Provided herein are III-V material-based nanowire field-effect transistor (FET) devices and techniques for the fabrication thereof. The use of III-V materials as the channel material in a FET is advantageous since III-V channels can have significantly higher electron mobility than silicon (Si) channels. Thus it is believed that III-V channels can offer higher FET performance than Si channels ever could.

The implementation of III-V channels however has several notable challenges. For example, depositing a III-V material on an Si or a Si-containing layer often results in a lattice mismatch between the materials. Further, III-V materials are brittle, and thus nanowires formed from III-V materials are subject to breakage when suspended over long distances. Advantageously, the present techniques address these challenges by employing a replacement gate Fin field-effect transistor (FinFET) process with an additional release layer added at the beginning of the process. As will be described in detail below, release of the nanowire removes the material interface at the channels, eliminating the lattice mismatch problem, and the present replacement gate process results in only short lengths of the nanowires being suspended, thus eliminating the chance of breakage. A further advantage of the present process is that only after the replacement gate is removed is the nanowire released, such that the nanowire (once formed) only needs to see the wire release and gate deposition steps. For the rest of the process the nanowire exists as a part of a fin, or is fully encapsulated in the gate. Thus, the integrity of the nanowire is protected throughout the majority of the process.

Figure 1:
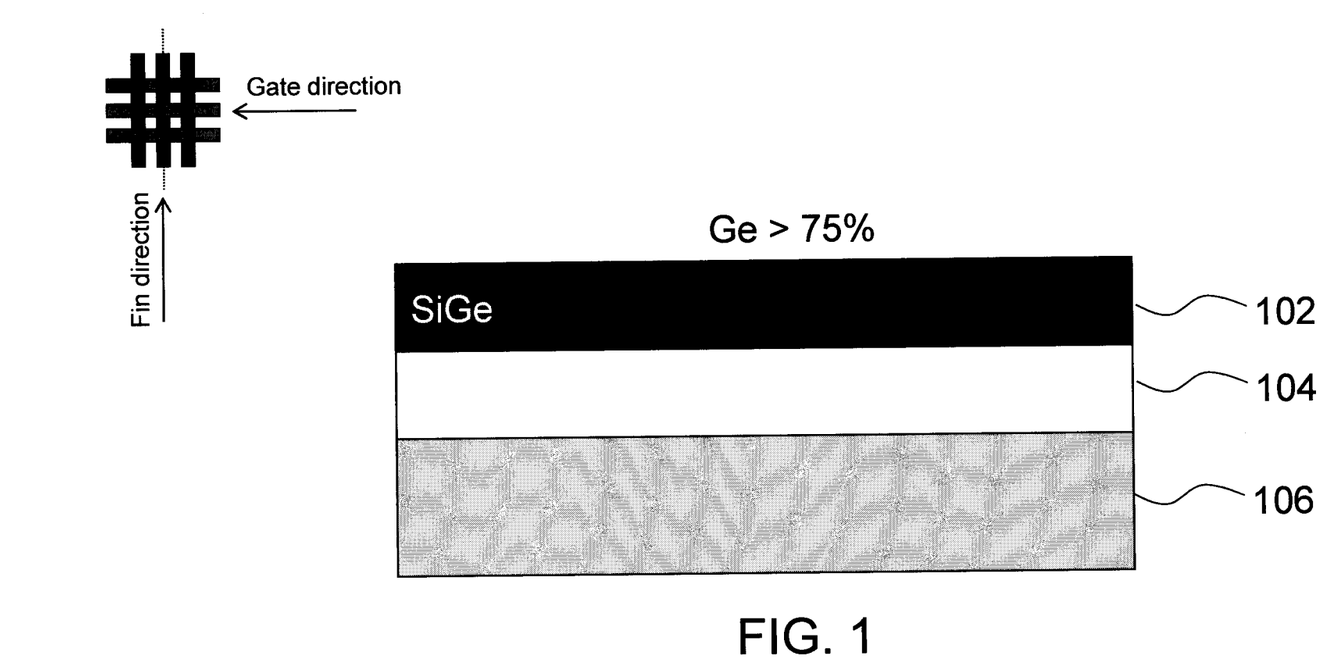
FIG. 1 is a cross-sectional diagram illustrating a starting platform for the fabrication of a gate-all-around nanowire field-effect transistor (FET), i.e., a semiconductor-on-insulator (SOI) wafer having an SOI layer separated from a substrate by a buried oxide (BOX), according to an embodiment of the present invention.

The present techniques are now described in detail by way of reference to FIGS. 1-12. FIG. 1 is a cross-sectional diagram illustrating a starting platform for the fabrication of a gate-all-around nanowire FET. Specifically, as shown in FIG. 1, the process begins with a semiconductor-on-insulator (SOI) wafer. A SOI wafer includes a semiconductor layer (e.g., SOI layer 102) separated from a substrate (e.g., substrate 106) by a buried oxide or box (e.g., BOX 104). According to an exemplary embodiment, the SOI layer 102 is a silicon germanium (SiGe) or a germanium (Ge)-containing layer. An SOI wafer having a SiGe SOI layer may also be referred to herein as a SiGe-on-insulator (SGOI) wafer, whereas an SOI wafer having a Ge SOI layer may also be referred to herein as a Ge-on-insulator (GeOI) wafer. According to an exemplary embodiment, a Ge concentration of the SOI layer 102 is greater than or equal to about 75%, e.g., from about 85% to about 100% (in the case where a GeSOI wafer is employed). The concentration of Ge in the SOI layer 102 can be increased using Ge condensation. See, for example, T. Tezuka et al., "Fabrication of strained Si on an ultrathin SiGe-on-insulator virtual substrate with a high-Ge fraction," Applied Physics Letters, vol. 79, no. 12, Sep. 17, 2001 (hereinafter "Tezuka"), the contents of which are incorporated by reference herein. As described in Tezuka, an oxidation process can be employed during which Ge atoms are rejected from a SiGe layer and condense in a remaining SGOI layer on the wafer. The specific conditions of this condensation process are provided in Tezuka.

Each of the figures illustrating the fabrication process will show a cross-sectional cut through a portion of the device structure. Thus a legend is provided at the top left corner of each figure illustrating the various orientations of the cuts shown. Specifically, by way of reference to the legend in FIG. 1, there are two orientations of cuts that will be illustrated throughout the figures. One is a cut along the fin direction. As will be described in detail below fins will be formed which will serve as the channel, source and drain regions of the device. The other is a cut along the gate direction. As will be described in detail below gate stacks will be formed surrounding nanowire channels of the device (gate all around configuration). Since FIG. 1 is showing the starting wafer (or substrate), the cross-sectional cut depicted is the same in either the fin direction or the gate direction.

Figure 2:
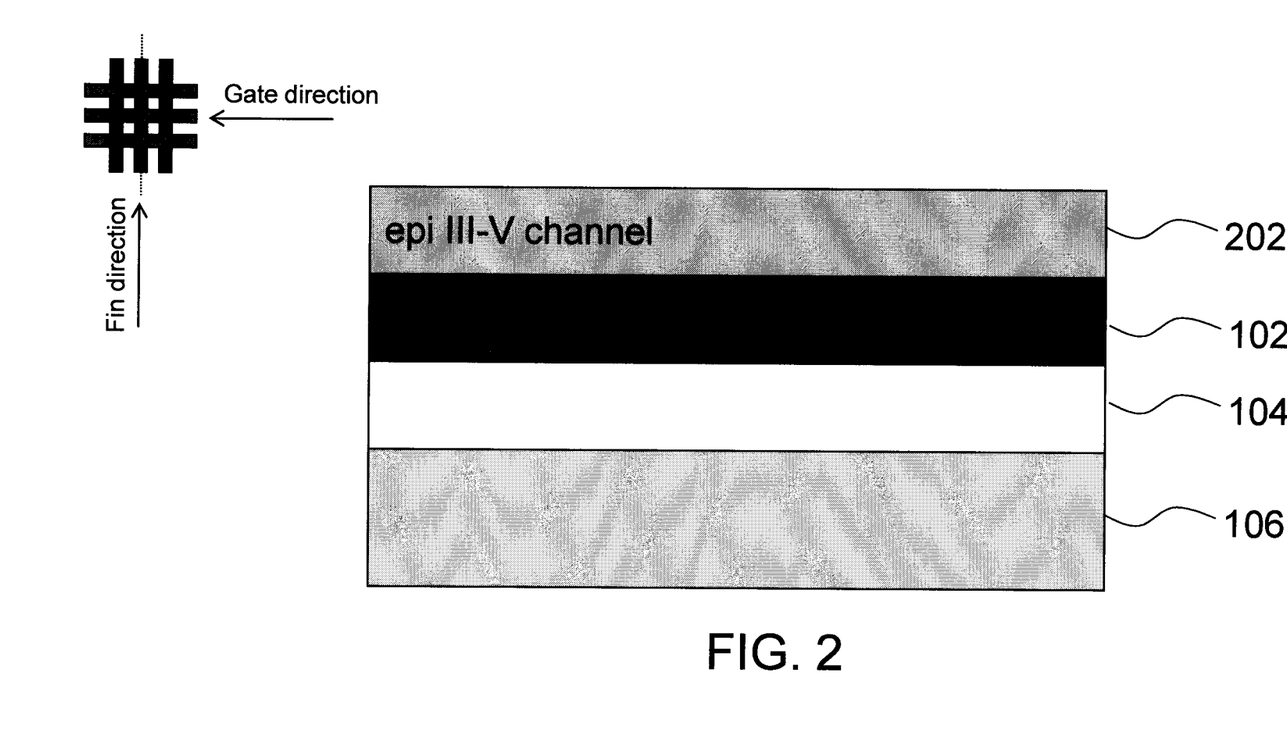
FIG. 2 is a cross-sectional diagram illustrating a layer of III-V material having been formed on the wafer according to an embodiment of the present invention.

Next, as shown in FIG. 2, a layer of III-V semiconductor material 202 is formed on the wafer, i.e., on the SOI layer 102. The term III-V semiconductor material (or simply III-V material), as used herein and throughout the following description, refers to a material that includes at least one group III element and at least one group V element. By way of example only, suitable III-V materials include, but are not limited to, one or more of aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide and combinations including at least one of the foregoing materials. According to an exemplary embodiment, the III-V material 202 is indium gallium arsenide (InGaAs). As will be described in detail below, the III-V material 202 constitutes a channel material for the gate-all-around nanowire FET device. In one exemplary embodiment, the III-V material 202 is epitaxially grown on the wafer using, for example, molecular beam epitaxy (MBE) or metalorganic chemical vapor deposition (MOCVD).

By epitaxially growing the III-V material 202 on the wafer, the resulting layer(s) will be near lattice-matched to the underlying SOI layer 102. Namely, the deposition of III-V materials on an Si layer (e.g., SOI layer 102) can be challenging due to lattice mismatch between the materials—the result often being islanding and/or misfit dislocation issues. However, by using an epitaxial growth process, the amount of misfit dislocation is minimized.

Further, the present techniques provide an effective solution for implementing III-V channel materials in a FET fabrication process flow. As described above, the deposition of III-V materials on a Si or Si-containing layer (e.g., SiGe) results in lattice mismatch between the materials. Thus, with fin FET or planar device architectures, the resulting lattice mismatch can affect device viability and performance. However, with the present techniques, as will be described in detail below, any of the misfit dislocation at the interface between the III-V material 202 and the SOI layer 102 in the channel regions of the device will be removed when the SOI layer 102 is etched (removed) in the channel regions, see FIG. 11—described below. Once the wire is released there is no material boundary and thus no misfit defect.

Further, as will be described in detail below, another advantage of the present techniques in the context of III-V channel FETs is that it accommodates the brittle nature of the III-V materials. Specifically, in a wire-first scheme there is a long length of suspended wires. When the wires are formed from a semiconductor such as Si, then wires in these wire-first configurations tend to sag. However, because the III-V materials are brittle, it is likely that the wires would break rather than sag if a wire-first scheme were implemented with III-V channel materials. Advantageously, with the present techniques, there is a short length of suspension (shorter than conventional wire-first approaches), thus preventing the (III-V) wires from breaking.

Reference to the legend at the top left corner of FIG. 2 shows the orientation of the cross-sectional cut depicted in FIG. 2. As with FIG. 1, since FIG. 2 is showing the starting wafer (or substrate), the cross-sectional cut depicted is the same in either the fin direction or the gate direction.

Figure 3:
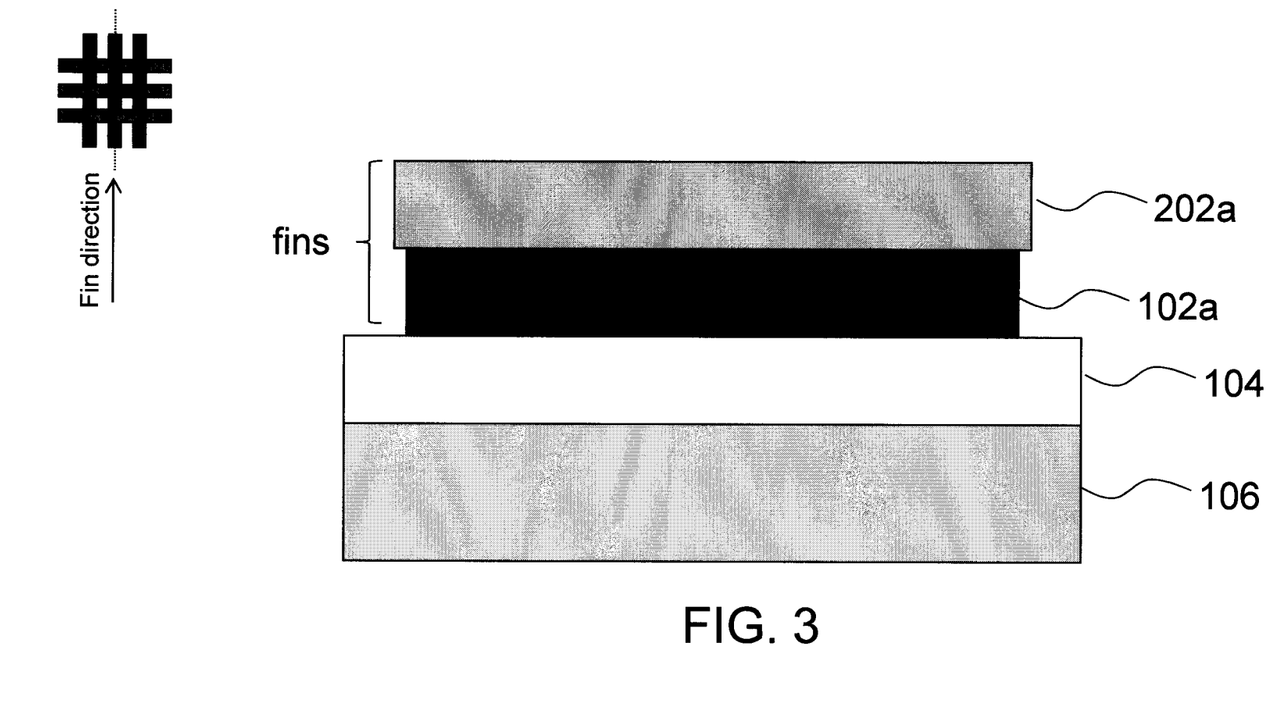
FIG. 3 is a cross-sectional diagram illustrating fins having been etched into the III-V material and the SOI layer according to an embodiment of the present invention.

Next, as shown in FIG. 3, fins are etched into the III-V material 202 and SOI layer 102. The fins will be used to form the source, drain and channel regions of the device. According to an exemplary embodiment, the fins are formed by first patterning a fin hardmask (not shown) on the III-V material 202 which is commensurate with the footprint and location of the fins. Suitable fin hardmask materials include, but are not limited to a nitride material, such as silicon nitride. Specifically, the given hardmask material is deposited onto the wafer and then is patterned using a lithography and etching process wherein a patterned resist film is used to pattern the fin hardmasks. By way of example only, the fin hardmasks may be patterned using reactive ion etching (RIE). In that case, the resist film would be formed from a resist material such as hydrogen silsesquioxane (HSQ) patterned using electron beam (e-beam) lithography and transferred to a carbon-based resist.

The fin hardmasks are then used to pattern the fins and as shown in FIG. 3, following the fin etch, any remaining fin hardmask material can be removed—e.g., using a wet or dry etch. According to an exemplary embodiment, the fins are etched in the III-V material 202 and SOI layer 102 using a RIE process wherein the BOX 104 acts as an etch stop. For clarity, the III-V material 202 and SOI layer 102 following the fin etch are referred to as patterned III-V material 202a and patterned SOI layer 102a.

Reference to the legend at the top left corner of FIG. 3 shows the orientation of the cross-sectional cut depicted in FIG. 3. Specifically, the orientation of the cross-sectional cut shown in FIG. 3 is along the fin direction, through one of the fins.

Figure 4:
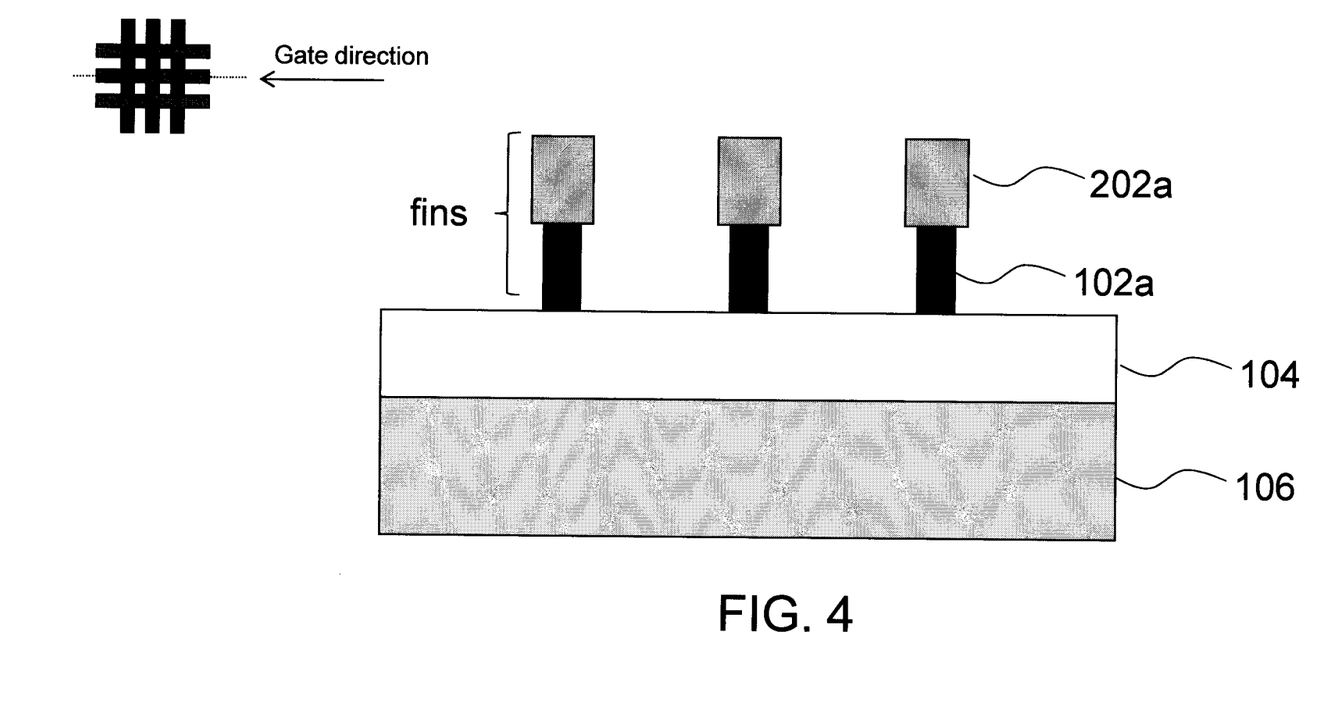
FIG. 4 is a cross-sectional diagram illustrating the etched fins from another perspective, i.e., as a cross-sectional cut through the gate direction of the device according to an embodiment of the present invention.

FIG. 4 depicts the etched fins from another perspective, i.e., as a cross-sectional cut through the gate direction of the device (see the legend at the top left corner of FIG. 4 which shows that the orientation of the cross-sectional cut depicted in FIG. 4 is along the gate direction). As can be seen from FIGS. 3 and 4, the patterned SOI layer 102a is thinner than the patterned III-V material 202a. This is the result of the patterned SOI layer 102a being etched laterally during the fin etch.

Figure 5:
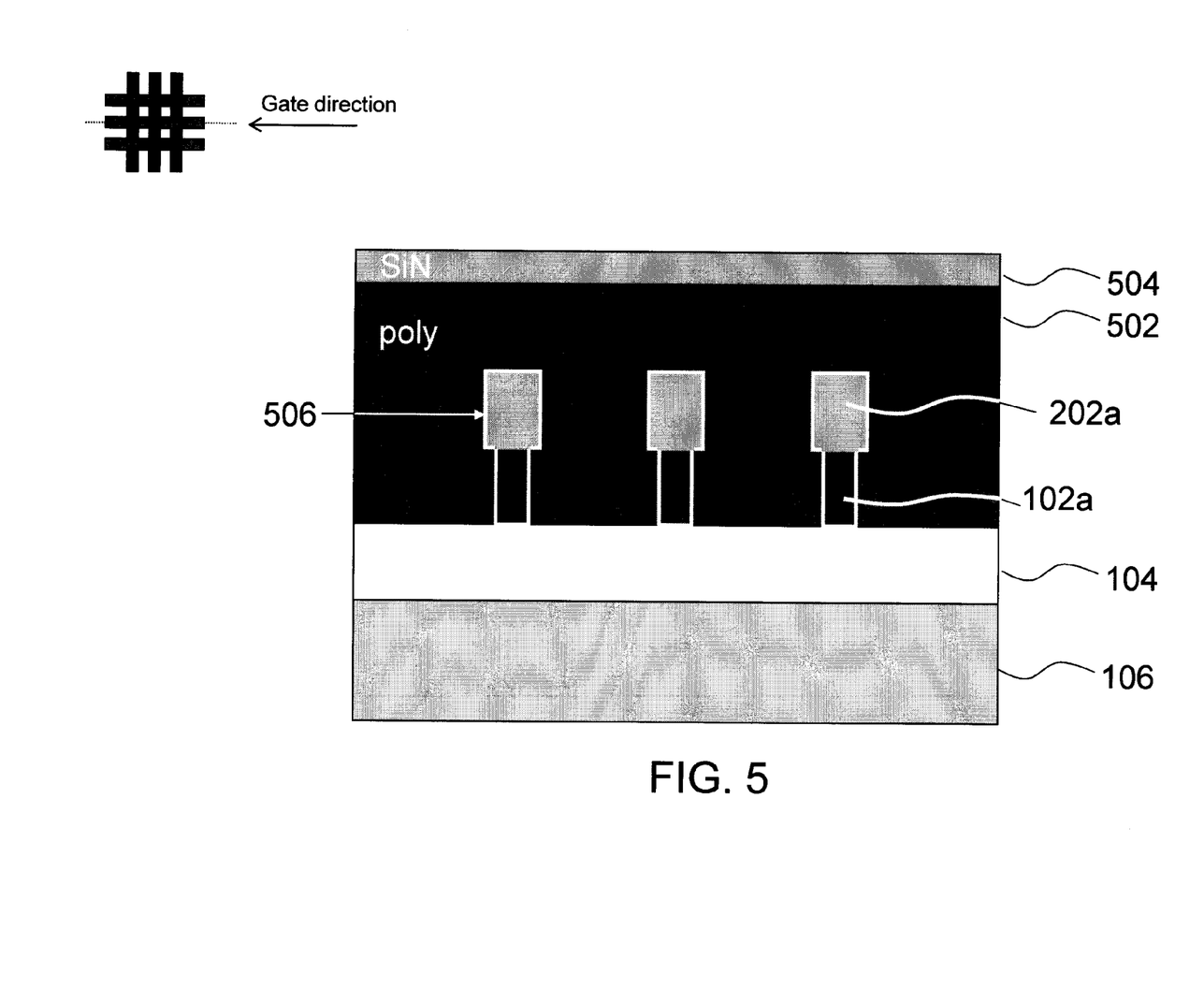
FIG. 5 is a cross-sectional diagram illustrating a dummy gate material having been deposited onto the wafer covering the fins and a dummy gate hardmask having been formed on the dummy gate material according to an embodiment of the present invention.

The present techniques employ a gate-last process wherein a dummy gate which is formed early in the fabrication process is later removed and replaced with a replacement gate. The formation of the dummy gate is now described. As shown in FIG. 5, the formation of the dummy gate begins with the deposition of a dummy gate material 502 onto the wafer covering the fins. Suitable dummy gate materials include, but are not limited to, poly-silicon (poly-Si)—deposited onto the wafer using, e.g., low pressure chemical vapor deposition (LPCVD).

Prior to depositing the dummy gate material, a dummy gate dielectric 506 may be formed on the fins. See FIG. 5. By way of example only, the dummy gate dielectric may be formed from an oxide material, such as silicon oxide, which is deposited onto the fins using a conformal deposition process, such as chemical vapor deposition (CVD). The dummy gate dielectric is formed to provide an etch stop layer for the dummy gate removal process. For instance, when poly-silicon is used as the dummy gate material, a layer is needed to protect the channel material during the poly-silicon removal step.

The deposited dummy gate material 502 may be planarized using, for example, chemical mechanical planarization (CMP), and dummy gate hardmasks 504 can be formed on the dummy gate material 502. The dummy gate hardmasks 504 and the positioning thereof are commensurate with the foot print and location of the dummy gates (see FIGS. 6-8, described below). As will be apparent from the following description, the dummy gate—after patterning—will be located over what will be the channel region of the device.

The process for forming (by lithography and etching) a hardmask, e.g., a nitride hardmask, was described above. That process and related materials are applicable here for forming the dummy gate hardmask. In the particular non-limiting example shown in FIG. 5, the dummy gate hardmask is formed from silicon nitride (SiN).

Reference to the legend at the top left corner of FIG. 5 shows the orientation of the cross-sectional cut depicted in FIG. 5. Specifically, the orientation of the cross-sectional cut shown in FIG. 5 is along the gate direction, through one of the dummy gate hardmasks and the dummy gate material.

The dummy gate hardmasks 504 are then used to pattern the dummy gate material to form one or more dummy gates 602 over the fins and separated from the fins by the dummy gate dielectric. See FIG. 6. Dummy gates 602 can be patterned using a poly-silicon selective RIE around the dummy gate hardmasks 504.

Figure 6:
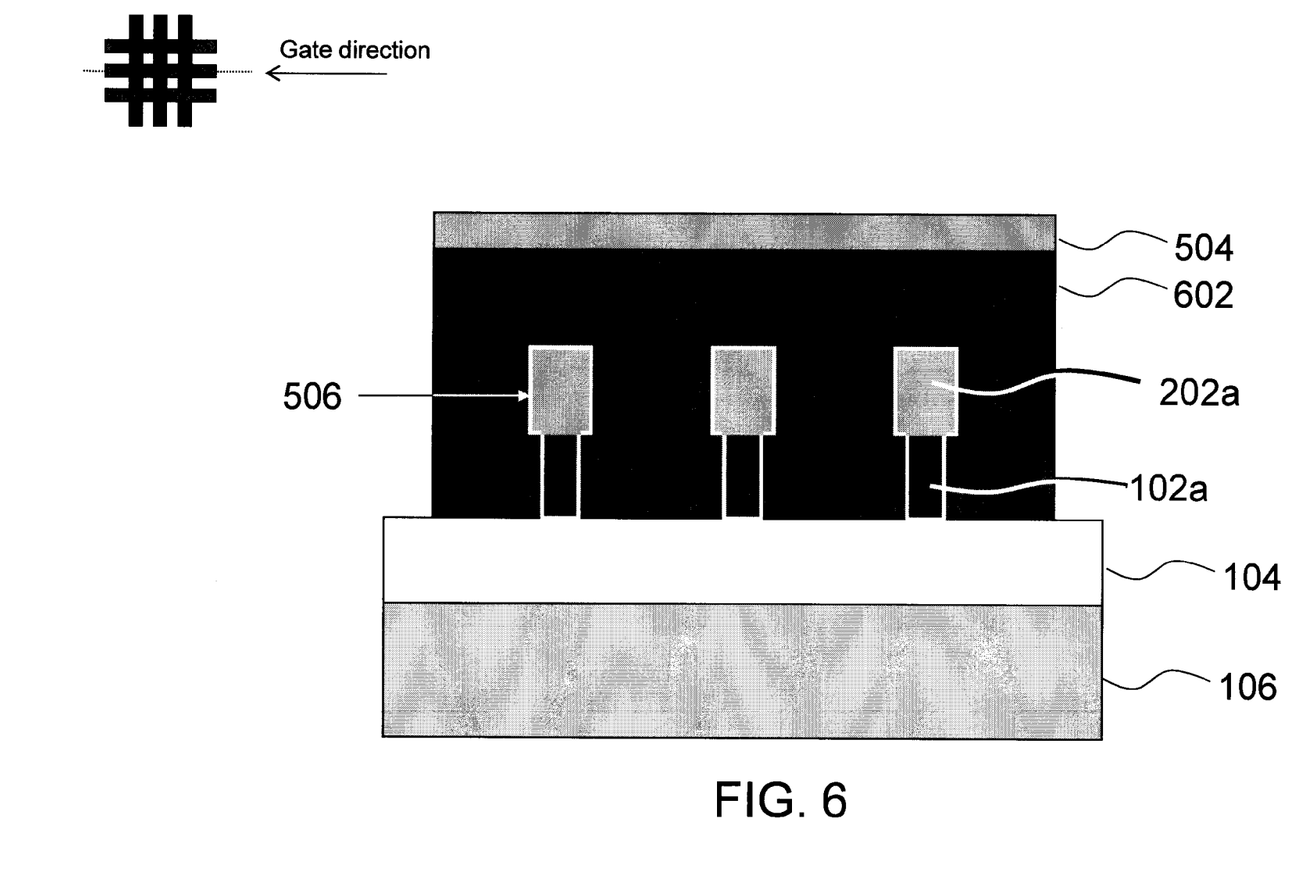
FIG. 6 is a cross-sectional diagram illustrating the dummy gate hardmasks having been used to pattern the dummy gate material to form one or more dummy gates according to an embodiment of the present invention.

Reference to the legend at the top left corner of FIG. 6 shows the orientation of the cross-sectional cut depicted in FIG. 6. Specifically, the orientation of the cross-sectional cut shown in FIG. 6 is along the gate direction, through one of the dummy gates 602.

Figure 7:
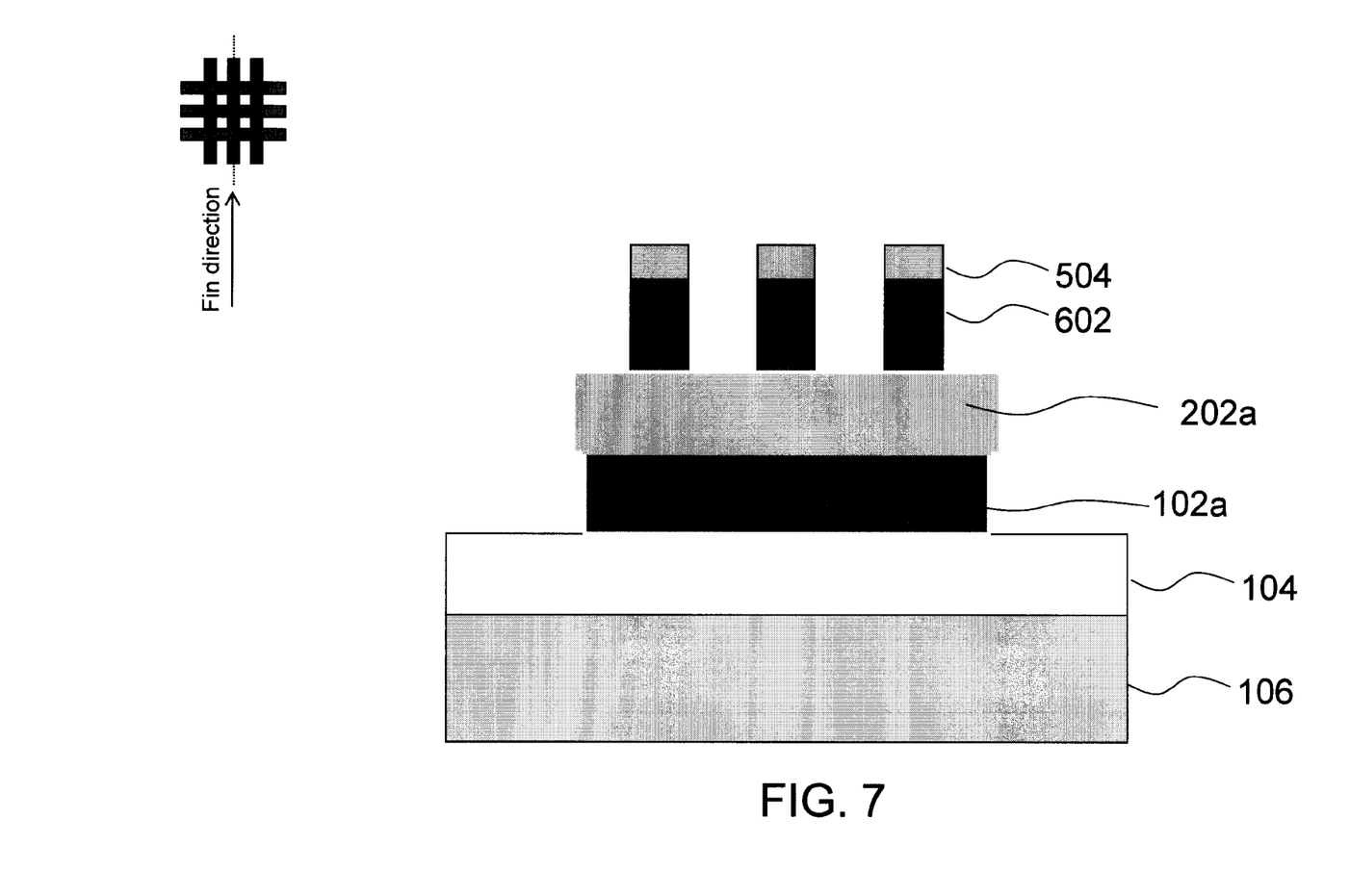
FIG. 7 is a cross-sectional diagram illustrating patterning of the dummy gates from another perspective, i.e., as a cross-sectional cut along the fin direction of the device, through one of the fins according to an embodiment of the present invention.
Figure 8:
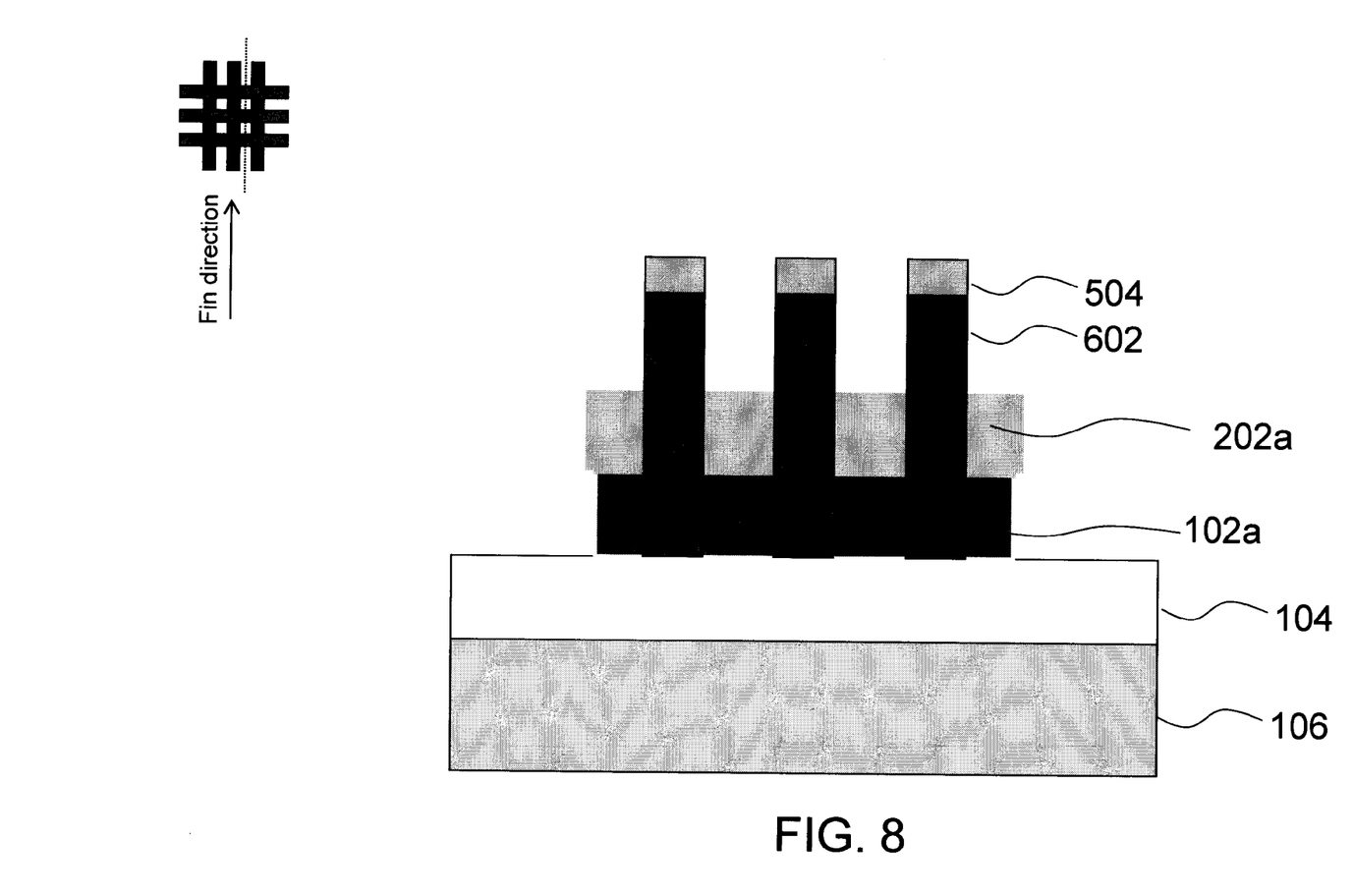
FIG. 8 is a cross-sectional diagram illustrating patterning of the dummy gates from yet another perspective, i.e., as a cross-sectional cut along the fin direction of the device, between two of the fins according to an embodiment of the present invention.

FIG. 7 is a cross-sectional diagram illustrating patterning of the dummy gates 602 from another perspective, i.e., as a cross-sectional cut along the fin direction of the device, through one of the fins. FIG. 8 is a cross-sectional diagram illustrating patterning of the dummy gates 602 from yet another perspective, i.e., as a cross-sectional cut along the fin direction of the device, between two of the fins.

Spacers 902 are then formed on opposite sides of the dummy gates 602. See FIG. 9. Spacers 902 serve to offset the gate a certain distance from the source/drain regions. According to an exemplary embodiment, spacers 902 are formed by first depositing a nitride layer onto the wafer, covering the fins. It is notable that III-V materials can be damaged by high processing temperatures (e.g., processing temperatures greater than about 400° C.). With conventional techniques, processes such as low pressure chemical vapor deposition (LPCVD) or rapid thermal chemical vapor deposition (RTCVD) are used to deposit the spacer material. These processes, however, employ high temperatures which can damage the III-V channel material. Thus according to the present techniques, a process is preferably employed that permits deposition of the spacer material at lower temperatures. Suitable low-temperature deposition processes for the spacer material include, but are not limited to plasma-enhanced chemical vapor deposition (PECVD). With PECVD deposition can be conducted at temperatures of from about 250° C. to about 400° C.

Figure 9:
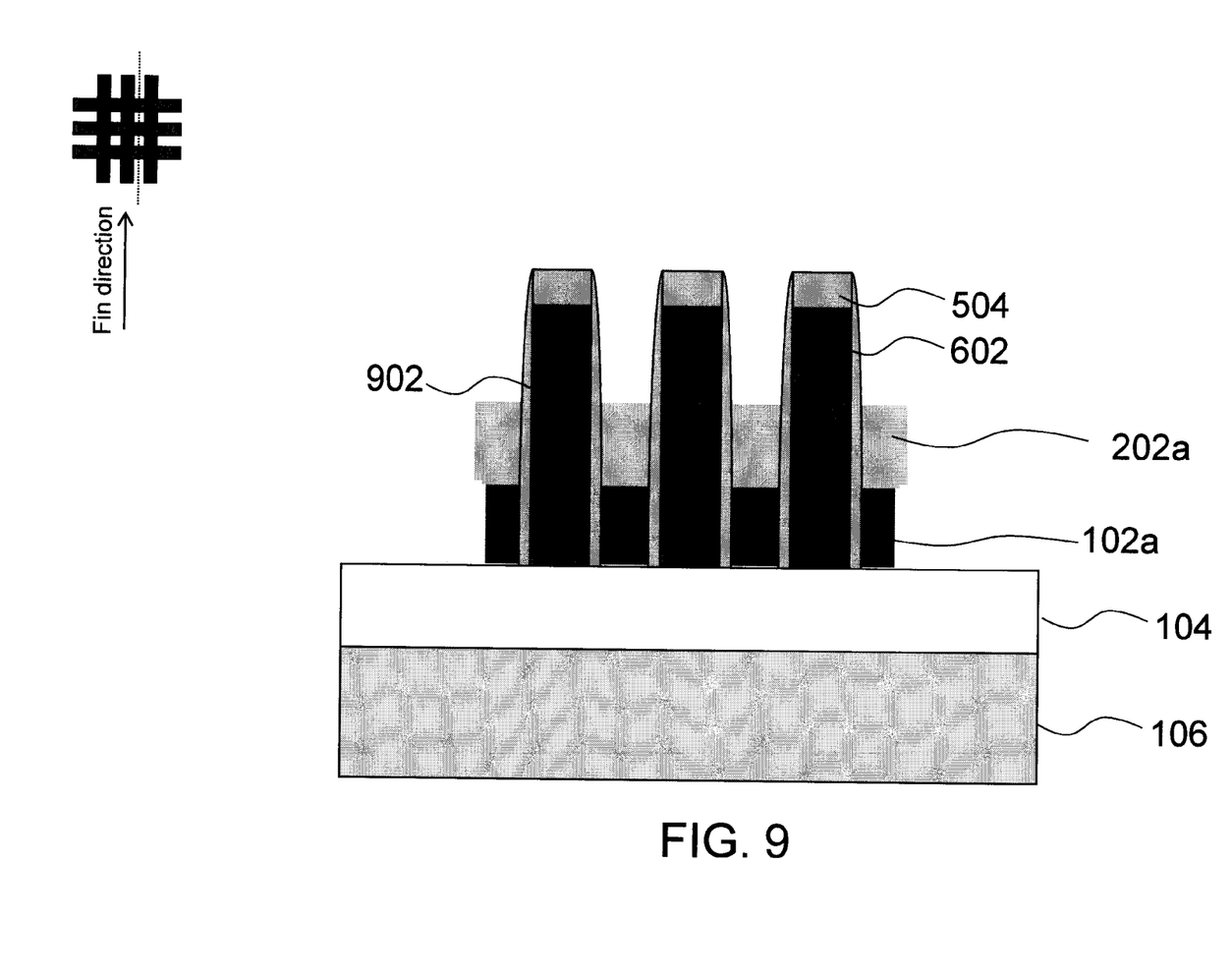
FIG. 9 is a cross-sectional diagram illustrating spacers having been formed on opposite sides of the dummy gates according to an embodiment of the present invention.

A resist film (not shown) is then deposited on the nitride layer, masked and patterned with a location and footprint of the spacers. A nitride-selective RIE is then used to define/pattern spacers 902 in the nitride layer.

Reference to the legend at the top left corner of FIG. 9 shows the orientation of the cross-sectional cut depicted in FIG. 9. Specifically, the orientation of the cross-sectional cut shown in FIG. 9 is along the fin direction, between two of the fins.

Figure 10:
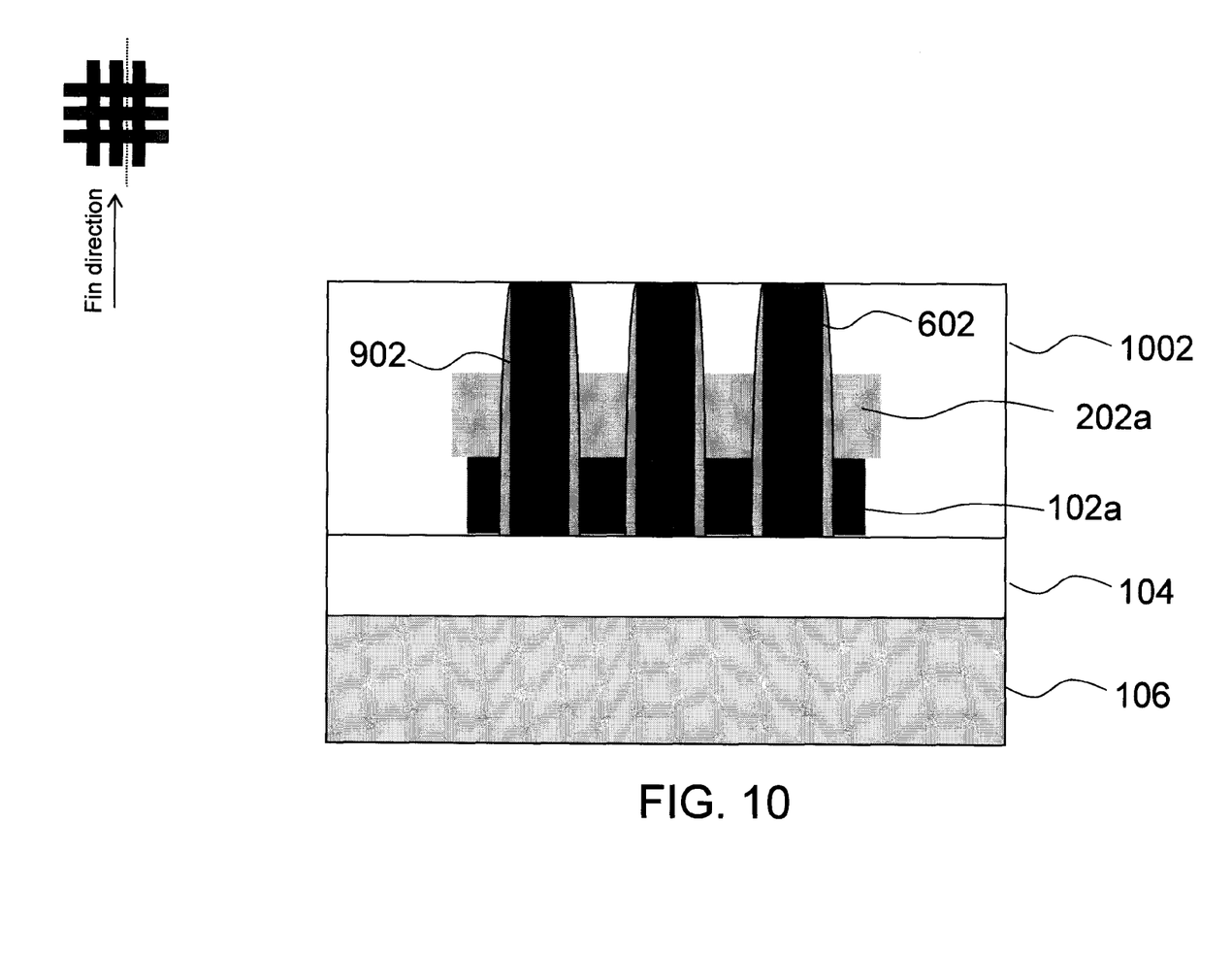
FIG. 10 is a cross-sectional diagram illustrating a gap filler material having been deposited onto the wafer filling the spaces between the fins and the dummy gates according to an embodiment of the present invention.

Next, as shown in FIG. 10, a gap filler material 1002 is deposited onto the wafer filling the spaces between the fins and the dummy gates. Suitable gap filler materials include, but are not limited to a dielectric material, such as silicon oxide. According to an exemplary embodiment, the gap filler material 1002 is deposited onto the wafer using a high-density plasma (HDP) and then planarized down to the dummy gates (see FIG. 10) using CMP. This planarizing step will serve to remove any remaining dummy gate hardmask material from the wafer.

Reference to the legend at the top left corner of FIG. 10 shows the orientation of the cross-sectional cut depicted in FIG. 10. Specifically, the orientation of the cross-sectional cut shown in FIG. 10 is along the fin direction, between two of the fins.

Figure 11:
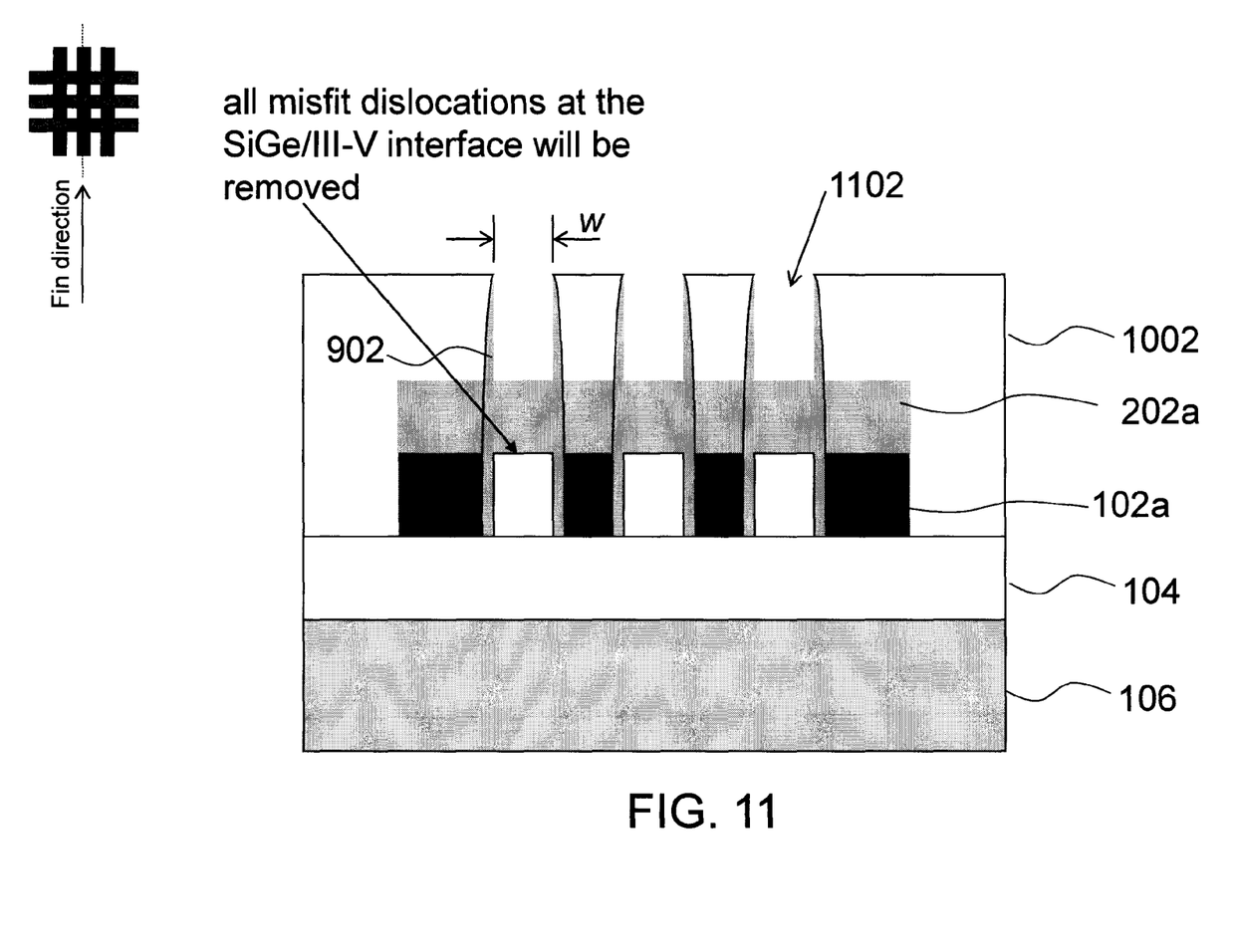
FIG. 11 is a cross-sectional diagram illustrating the dummy gates having been removed selective to the gap filler material resulting in trenches having been formed in the gap filler material and nanowires formed from III-V material having been released/suspended in the channel region according to an embodiment of the present invention.

As shown in FIG. 11, the dummy gates 602 are then removed selective to the gap filler material 1002. According to an exemplary embodiment, dummy gates 602 are removed using a chemical etching process, such as chemical down stream or potassium hydroxide (KOH) etching, or RIE. The dummy gate dielectric is removed in a separate step after the dummy gates are gone. By way of example only, for an oxide dielectric this could be done in wet etches like dilute hydrofluoric (HF) acid or buffered oxide etch (BOE), or possibly in a RIE process. The removal of dummy gates 602 results in trenches 1102 being formed in gap filler material 1002. According to an exemplary embodiment, trenches 1102 distinguish a (nanowire) channel region of the device from source and drain regions of the device.

As provided above, the III-V material 202 will be used to form nanowire channels of the device. In order to be able to form a gate (a replacement gate, see below) that surrounds the nanowire channels in a gate-all-around configuration, the nanowire channels have to be released from the fin. Namely, the patterned SOI layer 102a is removed from the fin, releasing the nanowires, resulting in suspended nanowires in the channel region formed from III-V material 202. See FIG. 11. The nanowire channels will form channel regions of the device, while portions of the fins outside of the trenches will form source and drain regions of the device. A replacement gate will be formed surrounding (in a gate-all-around configuration) the channel regions (see below).

As provided above, the deposition of a III-V material on an Si or Si-containing layer (such as SOI layer 102), due to the lattice mismatch in the materials causes misfit dislocation at the interface of the materials. Advantageously, with the present techniques, any misfit dislocation in the channel region is now removed with removal of the patterned SOI layer 102a from the channel regions—namely once the wire is released there is no material boundary and thus no misfit defect. Further, as provided above, III-V material nanowires are brittle and subject to breakage if suspended over relatively longer distances (as would be the case if a wire-first configuration were employed). Advantageously, with the present techniques, as shown in FIG. 11, the nanowire (channels) are suspended over only short distances. Specifically, according to the present techniques the nanowire channels are suspended only within the trenches 1102. By way of example only, the trenches may have a width w of only from about 10 nanometers (nm) to about 50 nm, e.g., 45 nm. The width of each of the trenches is equivalent to the length of the dummy gates removed to form the trenches. Thus, the length of the nanowire channels suspended in the trenches is preferably from about 10 nm to about 50 nm, e.g., about 45 nm, in order to avoid breakage of the wire. By comparison with a wire-first process, the nanowire can be suspended over distances greater than 100 nm.

The patterned SOI layer 102a may be removed from the fin stack as follows. A chemical etchant can be employed that exploits the lower oxidation potential of the SOI layer 102a as compared to the III-V material. Examples of such etchants include, but are not limited to a 1:2:3 mixture of HF:hydrogen peroxide ($H_2O_2$):acetic acid ($CH_3COOH$), or a mixture of sulfuric acid ($H_2SO_4$) and $H_2O_2$. Alternatively, the patterned SOI layer 102a can be selectively removed using a dry etching process such as oxygen ($O_2$) plasma etching or plasma chemistries typically used for etching.

Reference to the legend at the top left corner of FIG. 11 shows the orientation of the cross-sectional cut depicted in FIG. 11. Specifically, the orientation of the cross-sectional cut shown in FIG. 11 is along the fin direction, through one of the fins.

Replacement gates 1202 are then formed in the trenches 1102 surrounding the nanowire channels. See FIG. 12. The replacement gates 1202 are formed by first filling the trenches 1102 with a gate material(s). Once the gate material is filled into trenches 1102, CMP is used to planarize the gate material. Suitable gate materials include, but are not limited to, one or more of polysilicon, a deposited metal(s) and a hybrid stack of multiple materials such as metal polysilicon.

Figure 12:
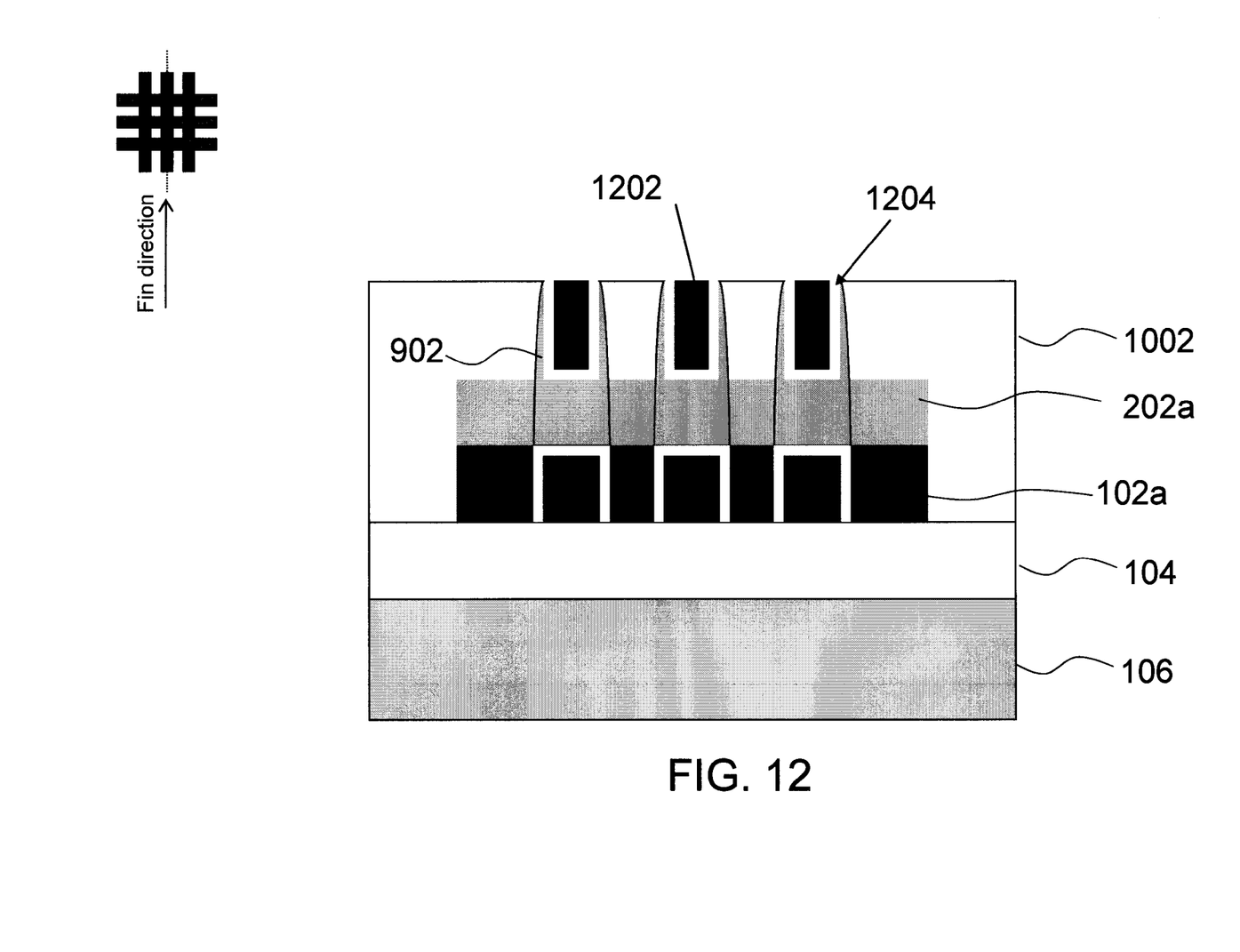
FIG. 12 is a cross-sectional diagram illustrating replacement gates having been formed in the trenches surrounding the nanowire channels according to an embodiment of the present invention.

Prior to the formation of the replacements gates 1202, a gate dielectric material 1204 is preferably first deposited surrounding the nanowire channels. According to an exemplary embodiment, the gate dielectric material 1204 employed is a high-k material, such as hafnium oxide, that is deposited using a conformal deposition process such as atomic layer deposition (ALD). High-k dielectrics are particularly well suited for this gate all around process flow due to the need for a small equivalent oxide thickness for performance and electrostatic control reasons and also the need for a relatively large physical thickness to fill gaps underneath the spacers. See below.

Reference to the legend at the top left corner of FIG. 12 shows the orientation of the cross-sectional cut depicted in FIG. 12. Specifically, the orientation of the cross-sectional cut shown in FIG. 12 is along the fin direction, through one of the fins.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a nanowire field-effect transistor (FET) device, the method comprising:
   providing a semiconductor-on-insulator (SOI) wafer having an SOI layer over a buried oxide (BOX);
   forming a layer of III-V semiconductor material on the SOI layer;
   etching fins into the III-V semiconductor material and the SOI layer such that each of the fins comprises a patterned portion of the SOI layer and a patterned portion of the III-V semiconductor material, wherein the patterned portion of the SOI layer is thinner than the patterned portion of the III-V semiconductor material in each of the fins due to lateral etching of the SOI layer during the etching of the fins into the III-V semiconductor material and the SOI layer;
   forming a dummy gate dielectric on the fins;
   forming one or more dummy gates over a portion of the fins that serves as a channel region of the nanowire FET device, wherein the one or more dummy gates are separated from the fins by the dummy gate dielectric;
   forming spacers on opposite sides of the one or more dummy gates;
   depositing a gap filler material onto the SOI wafer filling spaces between the fins and the one or more dummy gates;

removing the one or more dummy gates and the dummy gate dielectric selective to the gap filler material, forming trenches in the gap filler material;

removing the SOI layer from portions of the fins within the trenches thereby forming suspended nanowire channels in the channel region of the nanowire FET device, wherein other portions of the fins outside of the trenches will serve as source and drain regions of the nanowire FET device; and filling the trenches with at least one gate material to form one or more replacement gates surrounding the suspended nanowire channels in a gate-all-around configuration.

2. The method of claim 1, wherein the SOI layer comprises silicon germanium.

3. The method of claim 1, wherein the III-V semiconductor material comprises at least one group III element and at least one group V element.

4. The method of claim 1, wherein the III-V semiconductor material is selected from the group consisting of: aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide and combinations comprising at least one of the foregoing materials.

5. The method of claim 1, wherein the III-V semiconductor material is epitaxially grown on the SOI layer.

6. The method of claim 1, wherein the dummy gate dielectric comprises an oxide material.

7. The method of claim 1, wherein the dummy gate dielectric is deposited onto the fins using a chemical vapor deposition.

8. The method of claim 1, wherein the one or more dummy gates comprise poly-silicon.

9. The method of claim 1, wherein the gap filler material comprises a dielectric material.

10. The method of claim 1, further comprising:
depositing a gate dielectric material surrounding the suspended nanowire channels prior to the filling the trenches with the at least one gate material.

11. The method of claim 10, wherein the gate dielectric material comprises a high-k dielectric.

12. The method of claim 1, wherein the spacers are formed on the opposite sides of the one or more dummy gates by (i) depositing a nitride layer onto the SOI wafer, covering the fins, using plasma enhanced chemical vapor deposition, and (ii) patterning the nitride layer to form the spacers.

13. The method of claim 1, wherein a length of the suspended nanowire channels in the trenches is from about 10 nm to about 50 nm.

14. The method of claim 1, wherein after the etching of the fins into the III-V semiconductor material and the SOI layer, the patterned portion of the SOI layer is thinner than the patterned portion of the III-V semiconductor material in at least a dimension parallel to a length of the fins.

15. The method of claim 1, wherein after the etching of the fins into the III-V semiconductor material and the SOI layer, the patterned portion of the SOI layer is thinner than the patterned portion of the III-V semiconductor material in at least a dimension perpendicular to a length of the fins.

* * * * *